(12) United States Patent
Sjöström et al.

(10) Patent No.: US 8,137,875 B2
(45) Date of Patent: Mar. 20, 2012

(54) METHOD AND APPARATUS FOR OVERLAY COMPENSATION BETWEEN SUBSEQUENTLY PATTERNED LAYERS ON WORKPIECE

(75) Inventors: Fredrik Sjöström, Täby (SE); Mikael Wahlsten, Stockholm (SE)

(73) Assignee: Micronic-Mydata AB, Taby (SE)

( * ) Notice: Subject to any disclaimer, the term of this patent is extended or adjusted under 35 U.S.C. 154(b) by 277 days.

(21) Appl. No.: 12/453,837

(22) Filed: May 22, 2009

(65) Prior Publication Data

US 2009/0325088 A1    Dec. 31, 2009

Related U.S. Application Data

(60) Provisional application No. 61/071,871, filed on May 22, 2008.

(51) Int. Cl.
*G03F 9/00* (2006.01)
(52) U.S. Cl. ............. 430/30; 430/22; 356/601; 356/630
(58) Field of Classification Search .................... 430/22, 430/30; 356/601, 630
See application file for complete search history.

(56) References Cited

U.S. PATENT DOCUMENTS

| 5,866,281 | A | 2/1999 | Guckel et al. |
| 7,148,971 | B2 * | 12/2006 | Stiblert et al. ................ 356/601 |
| 2003/0174879 | A1 | 9/2003 | Chen |
| 2004/0150707 | A1 | 8/2004 | Stiblert et al. |
| 2005/0161426 | A1 | 7/2005 | Ozaki et al. |
| 2005/0214657 | A1 | 9/2005 | Mitsui |

FOREIGN PATENT DOCUMENTS

EP    1 713 113    10/2006

OTHER PUBLICATIONS

International Preliminary Report dated Dec. 2, 2010.
International Search Report and Written Opinion dated Sep. 17, 2009 for corresponding International Application No. PCT/IB2009/005685.
European Search Report dated Oct. 4, 2011.

* cited by examiner

*Primary Examiner* — Christopher Young
(74) *Attorney, Agent, or Firm* — Harness, Dickey & Pierce, PLC

(57) ABSTRACT

Methods and apparatuses for patterning workpieces are provided. The methods and apparatuses described herein improve overlay between subsequently patterned layers on a workpiece by introducing an improved alignment method that compensates for workpiece distortions.

11 Claims, 5 Drawing Sheets

US 8,137,875 B2

METHOD AND APPARATUS FOR OVERLAY COMPENSATION BETWEEN SUBSEQUENTLY PATTERNED LAYERS ON WORKPIECE

CROSS-REFERENCE TO RELATED APPLICATION(S)

This application claims priority under 35 U.S.C. §119(e) to U.S. Provisional Application No. 61/071,871, filed 22 May 2008, the entire contents of which are incorporated herein by reference.

This application is also related to PCT application no. PCT/IB2009/005685 to Mikael Wahlsten and Fredrik Sjöström, filed on 22 May 2009, the entire contents of which are incorporated herein by reference.

FIELD

Example embodiments relate to methods of manufacturing of photomasks, templates, substrates, devices or other workpieces that rely on multiple exposures and/or patterning steps on the same workpiece. More specifically, example embodiments provide methods and apparatuses for improving the alignment between multiple patterning steps by accounting for deformation of the workpiece between said patterning steps.

BACKGROUND

Creation of phase shift photomasks (PSMs) is an example process that relies on good overlay between layers. PSMs are often used to improve the image quality of the exposure of an image reproduced by a stepper on a wafer. There exist a number of conventional methods to create PSMs. But, typically all of these methods require sufficiently accurate alignment between the first and subsequent layers.

Production of Half Tone (HT) masks is another example where sufficiently accurate overlay between layers is important. In HT photomask production, a mask consisting of areas with different transmission regions (e.g., about 0%, about 50% and about 100%) is manufactured. Conventionally, this process involves patterning a workpiece at least twice with intermediate process steps. These types of masks are normally used in order to combine two or more patterns to create a TFT array backplane, which reduces the number of physical masks needed for a certain design.

Manufacturing 3 dimensional (3D) structures, typically used for imprinting stamps or other manufacturing technologies that rely on 3D structures, are also created by subsequent patterning steps with intermediate process steps (e.g., development and/or etching) between the patterning steps. In these manufacturing processes, sufficiently accurate overlay between patterning or definition steps is important to ensure structure quality.

The above-mentioned workpieces, masks, substrates, templates, etc. are normally used in the manufacturing process of display applications such as thin-film transistor-liquid crystal displays (TFT-LCD), organic light emitting diodes (OLEDs), surface-conduction electron-emitter display (SED), plasma display panels (PDPs), field emission displays (FEDs), low temperature poly-silicon LCDs (LTPS-LCD) and similar display technologies. Other areas of use are in the manufacturing of semiconductor devices and support structures such as memories (e.g., SRAM, DRAM, FLASH, ferroelectric, ferromagnetic, etc.), integrated circuits (ICs), printed circuit boards (PCBs), IC substrates, charge coupled device (CCD) sensors, complimentary metal oxide semiconductor (CMOS) sensors, holograms, PWB, etc.

Layer-to-layer overlay is also a somewhat critical property in direct patterning or "maskless" patterning techniques. In these techniques, the template or photomask is normally replaced with a fast pattern generator. The fast pattern generators for maskless production (referred to as "direct write tools") have the ability to overlay subsequent patterns on the same workpiece; that is directly on the intended device.

Conventionally, second and subsequent layer patterning normally relies on point alignment. When using point alignment a finite number of alignment marks patterned on a reference layer act as a guide for subsequent patterning. Hence, a first layer to be patterned includes alignment marks and after development, etch, resist spinning or other processes the workpiece is ready for the next layer exposure.

Prior to the patterning subsequent layers of the workpiece the alignment marks are read by the patterning system. In order to be able to fit the subsequent layer on top or in a specific relation to the first layer, the system calculates transformation factors (e.g., rotation, translation, scale, orthogonality, etc.). These calculated transformation factors are used in the subsequent patterning step to achieve adequate overlay between the patterned layers.

In theory, by calculating and using transformation factors (e.g., translation, rotation, scaling and/or orthogonality) sufficiently accurate overlay may be achieved. But, this is only true when the workpiece is considered to be essentially rigid.

Unfortunately, in the manufacturing of photomasks, for example, the masks themselves cannot be considered rigid bodies. Instead, the plates suffer from deformation or distortion during the first or subsequent patterning steps. This deformation may be caused by particles on the backside of a workpiece, changes in patterning conditions, pattern design, placement on a plate support, etc. Because these deformations normally lead to local and geometrically complex deformations or distortions, they cannot be compensated for by using simple global parameters.

Conventionally, additional alignment marks may be added in the first or reference layer to achieve a better approximation of how the workpiece distorts between patterning steps. However, the introduction of additional alignment marks is typically impossible because the main part of a workpiece is covered with a functional pattern and therefore cannot include alignment marks.

Furthermore, it is relatively difficult (if not impossible) to achieve an acceptable prediction in advance on where the distortion will take place, and therefore, it is not a viable solution to increase the number of alignment marks in specific areas. Typically, alignment marks are only allowed around the pattern area or image field and are often positioned relatively close to the peripheral edges of the workpiece.

U.S. Pat. No. 7,148,971 introduces the possibility to use Z-correction in a writer and a measurement machine. The Z-correction enables calibration of the reference coordinate system independent of the Z-shape of the reference layer. There exists such a measurement system on the market, but not all makers of large photomasks have acquired such a machine. Thus, it is not a generally accepted standard yet.

The current trend on the market is that large photomasks will get more and more advanced, and for TFT photomasks second layer writing will become more common. In the future, it is likely that masks will become even more advanced, including more than two layers. For more advanced masks, the overlay between layers is of even more importance to achieve a good yield of the final product because usually the plates that use more than one layer writing are the most critical layers in a mask set.

Another growing field of technology which requires sufficiently accurate overlay between written passes is three-dimensional (3D) writing using photolithographic methods. Multi-pass writing may be used to create a 3D structure by performing process steps in-between each exposure to provide the 3D shape. This requires relatively good alignment between each written pass.

SUMMARY

To meet the future requirements identified above, methods and apparatuses that suppress, reduce and/or eliminate the negative impact on layer-to-layer overlay caused by workpiece distortion between the patterning of subsequent layers on the workpiece are provided. The methods and apparatuses suppress, reduce and/or eliminate the negative impact on layer-to-layer distortion without compromising the original pattern design or reducing the usable workpiece surface area for patterning.

Methods and apparatuses according to example embodiments may not affect the absolute registration of the writer.

Example embodiments may be applicable to fields for multiple layer writing, which do not have very strict requirements on absolute registration. Therefore, example embodiments do not put any extra requirements on the measurement machine or tool to verify the registration of the final plate.

At least some example embodiments provide methods and apparatuses for improving overlay between subsequently patterned layers on a workpiece by introducing an improved alignment method that compensates for workpiece distortions.

Example embodiments also provide methods and apparatuses for generating patterns in which relative differences between a first reference layer and subsequent layers are compensated, without affecting the absolute registration of the apparatus. Hence, the use of methods according to example embodiments may be transparent, substantially transparent or totally transparent to the end user, and do not put any additional requirements on the measurement machine or tool verifying the registration.

Example embodiments also provide methods and apparatuses for improving subsequent layer alignment to previous layer(s) without the need to introduce more alignment marks in the previous layer(s).

Example embodiments also provide methods and apparatuses for improving layer-to-layer overlay based on a "gridless"/continuous one- or multi-dimensional compensation describing the distortion and/or deformation of the workpiece between patterning steps.

At least one example embodiment provides a method for patterning and aligning a workpiece. According to at least this example embodiment, the method comprises: acquiring a first Z-shape of the workpiece; patterning a reference grid on the workpiece; acquiring a second Z-shape of the workpiece; calculating a set of compensation values based on the acquired first and second Z-shapes; updating the reference grid based on the calculated set of compensation values; and patterning a subsequent layer of the workpiece.

The method may further include processing the workpiece before acquiring a second Z-shape of the workpiece. According to at least some example embodiments, the workpiece may be processed before acquiring a second Z-shape of the workpiece. Alignment marks may be patterned before or after acquiring a first Z-shape of the workpiece.

At least one global transformation may be calculated based on the calculated set of compensation values; and the reference grid may be updated based on the global transformation.

According to at least some example embodiments, the reference grid may be patterned by a first pattern generator and the subsequent layer may be patterned by a second pattern generator. The overlay errors due to a difference between the first Z-shape and the second Z-shape may be compensated for without changing the absolute registration.

According to at least some example embodiments, the acquiring of the first Z-shape may include measuring a height in the Z-direction at each of a plurality of measurement points on the workpiece to generate a set of first height measurements. The acquiring of the second Z-shape may include measuring a height in the Z-direction at each of a plurality of measurement points on the workpiece to generate a set of second height measurements.

According to at least some example embodiments, the set of compensation values includes a compensation value corresponding to each of the plurality of measurement points. In this example, the calculation of each of the compensation values may include calculating a difference between a first height measurement and a second height measurement at a measurement point among the plurality of measurement points, and calculating the compensation value for the measurement point based on the calculated difference and the thickness of the workpiece.

At least one other example embodiment provides an apparatus for patterning a workpiece. The apparatus includes means for acquiring a first Z-shape of the workpiece; a means for patterning a reference grid; means for processing the workpiece; means for acquiring a second Z-shape of the workpiece; means for calculating a set of compensation values based on the first and second Z-shapes; means for updating the reference grid based on the set of compensation values; and means for patterning a subsequent layer of the workpiece.

The apparatus may further include means for calculating at least one global transformation based on the calculated set of compensation values; and means for updating the reference grid based on the global transformation. The apparatus may further include means for patterning alignment marks.

The means for acquiring the first Z-shape may include means for measuring a height in the Z-direction at each of a plurality of measurement points on the workpiece to generate a set of first height measurements. The means for acquiring the second Z-shape may include means for measuring a height in the Z-direction at each of a plurality of measurement points on the workpiece to generate a set of second height measurements.

According to at least some example embodiments, the set of compensation values includes a compensation value corresponding to each of the plurality of measurement points. The means for calculating each of the compensation values may include means for calculating a difference between a first height measurement and a second height measurement at a measurement point among the plurality of measurement points; and means for calculating the compensation value for the measurement point based on the calculated difference and the thickness of the workpiece.

At least one other example embodiment provides an apparatus for patterning a workpiece. The apparatus includes a pattern generating apparatus and a Z-correction and processing module. The pattern generating apparatus is configured to pattern at least a first and a second layer of the workpiece, acquire a first z-shape of the workpiece one of before and after patterning the first layer of the workpiece, and acquire a second z-shape of the workpiece after patterning the second layer of the workpiece. The Z-correction and processing module is configured to calculate a compensation value based on the first and second Z-shapes, and update the reference grid based on the calculated compensation value.

According to at least one example embodiment, the pattern generating apparatus includes a stage on which the workpiece is arranged, a measurement tool configured to acquire the first and second Z-shapes of the workpiece, and a pattern generating tool configured to pattern at least the first and the second layer of the workpiece.

The set of compensation values may include a compensation value corresponding to each of the plurality of measurement points. The measurement tool is configured to acquire the first Z-shape by measuring a height in the Z-direction at each of a plurality of measurement points on the workpiece to generate a set of first height measurements. The measurement tool is also configured to acquire the second Z-shape by measuring a height in the Z-direction at each of a plurality of measurement points on the workpiece to generate a set of second height measurements.

The Z-correction and processing module is configured to calculate each of the compensation values by calculating a difference between a first height measurement and a second height measurement at a measurement point among the plurality of measurement points, and calculating the compensation value for the measurement point based on the calculated difference and the thickness of the workpiece.

BRIEF DESCRIPTION OF THE DRAWINGS

The general inventive concept will become more apparent given the following description of example embodiments with respect to the drawings in which.

DETAILED DESCRIPTION

The following descriptions are made in reference to the figures. Example embodiments are described in order to illustrate the present invention, not to limit its scope.

It is noted that methods are described as a process depicted as a flowchart or flow diagram. Although the flowchart or flow diagram may describe the operations as a sequential process, the operations may be performed in parallel, concurrently or simultaneously. In addition, the order of the operations may be re-arranged. A process may be terminated when its operations are completed, but may also have additional steps (e.g., iterations) not included in the figure. A process may correspond to a method, a function, a procedure, a subroutine, a subprogram, etc. When a process corresponds to a function, its termination may correspond to a return of the function to the calling function or the main function.

Furthermore, methods described herein may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a storage medium. A processor(s), field programmable gate array (FPGA), application specific integrated circuit (ASIC), etc. may perform the necessary tasks. The term "storage medium" may represent one or more devices for storing data, including read only memory (ROM), random access memory (RAM), magnetic RAM, core memory, magnetic disk storage mediums, optical storage mediums, flash memory devices and/or other machine readable mediums for storing information. The term "computer-readable medium" may include, but is not limited to, portable or fixed storage devices, optical storage devices, wireless channels and various other mediums capable of storing, containing or carrying instruction(s) and/or data.

A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

Example embodiments provide methods and apparatuses for generating a pattern during which distortions originating from particles between a workpiece (e.g., a large area photomask) and a stage may be compensated for.

Figure 1:
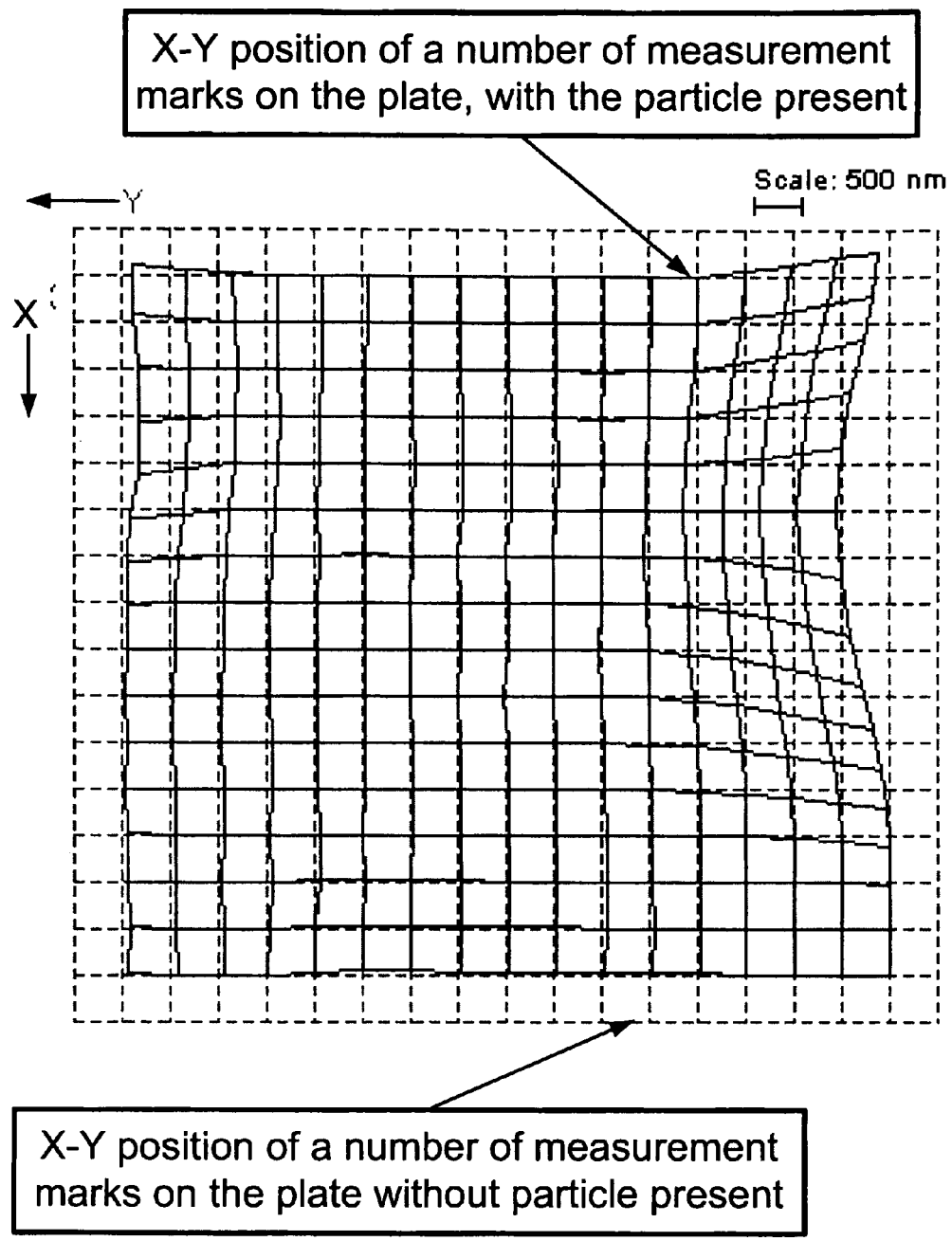
FIG. 1 shows example distortion in the X-Y plane of the plate caused by a particle.
Figure 2:
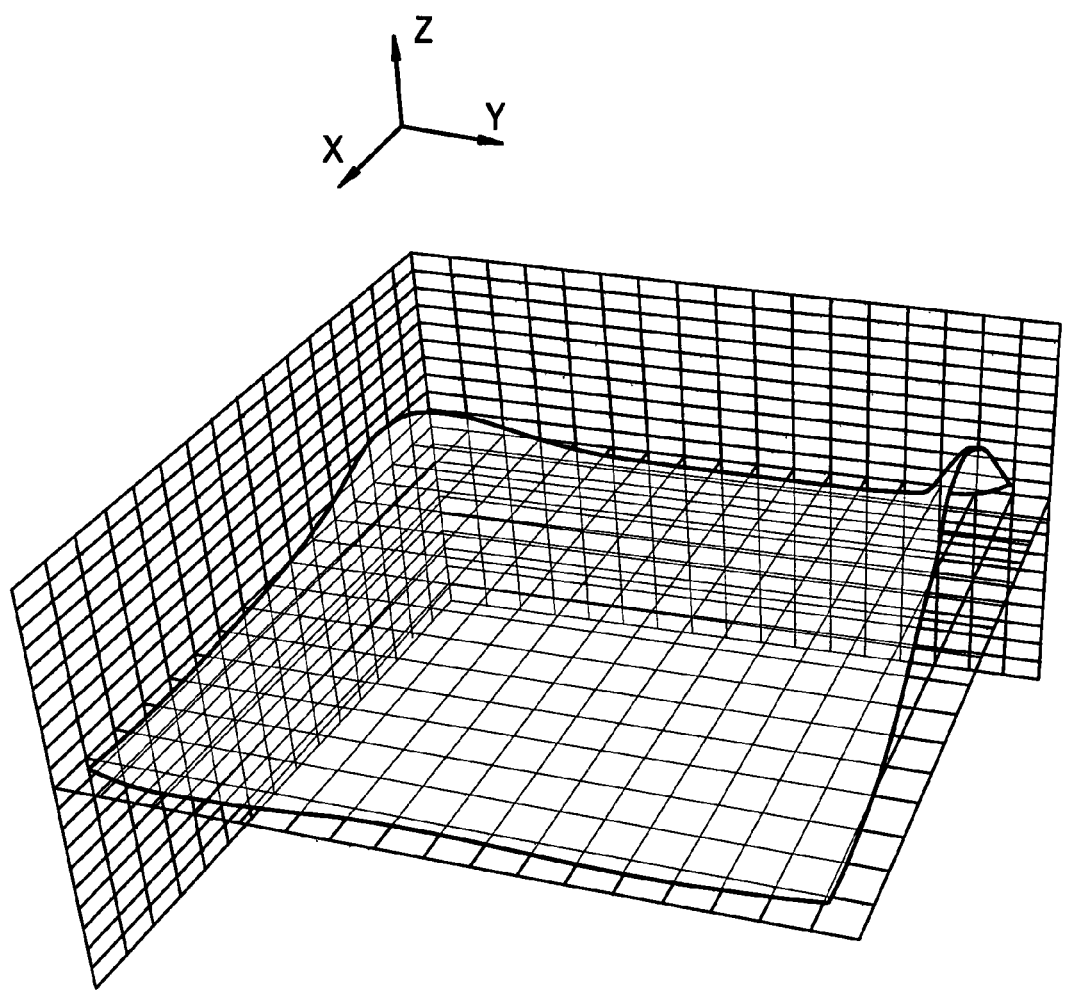
FIG. 2 illustrates an example difference in Z-shape between two measurements of the plate described in FIG. 1.

FIG. 1 illustrates the difference between two measurements of the X-Y position of a number of measurement marks on the plate with and without the particle present. FIG. 2 is a perspective view showing the example difference in Z-shape of the plate between the two measurements. Specifically, FIGS. 1 and 2 show the impact of a 15 μm particle trapped between a flat substrate carrier and a 10 mm thick quartz photomask.

If a particle is not present when patterning a first layer (also referred to herein as a reference layer) including alignment marks, but present when patterning a subsequent layer, sufficiently accurate overlay between the patterns or patterned layers may not be achieved. This is especially true if only global parameters (e.g., scale, orthogonality, rotation, translation, etc.) calculated based on the measurement of the alignment marks in the first layer is used for the transformation of the writing or reference grid used for the subsequent patterning step.

Furthermore, distortion that is present within an area of a workpiece (e.g., a photomask, substrate, wafer, etc.) where there are no measurable alignment marks cannot be directly compensated for by measuring the existing alignment marks. For this particular case, when there are no measurable alignment marks in the vicinity of a local distortion of a workpiece (e.g., caused by a particle) it is difficult or even impossible to make a sufficiently accurate (good) estimate of the local distortion in the X-Y plane by analyzing the change in the measured form of the surface of the workpiece.

Local distortions in the X-Y plane may be detected based on measurements in the Z-direction and the particular problem with local distortions discussed above may be at least partly alleviated by compensating for the distorted Z-shape as described in U.S. Pat. No. 7,148,971, the entire contents of which are incorporated herein by reference. However, there are certain considerations associated with implementing the Z-shape compensation method described in U.S. Pat. No. 7,148,971 in a multi-layer writing strategy or for patterning with multiple exposures with intermediate process steps that will be discussed below, and that may be addressed by example embodiments.

Figure 5:
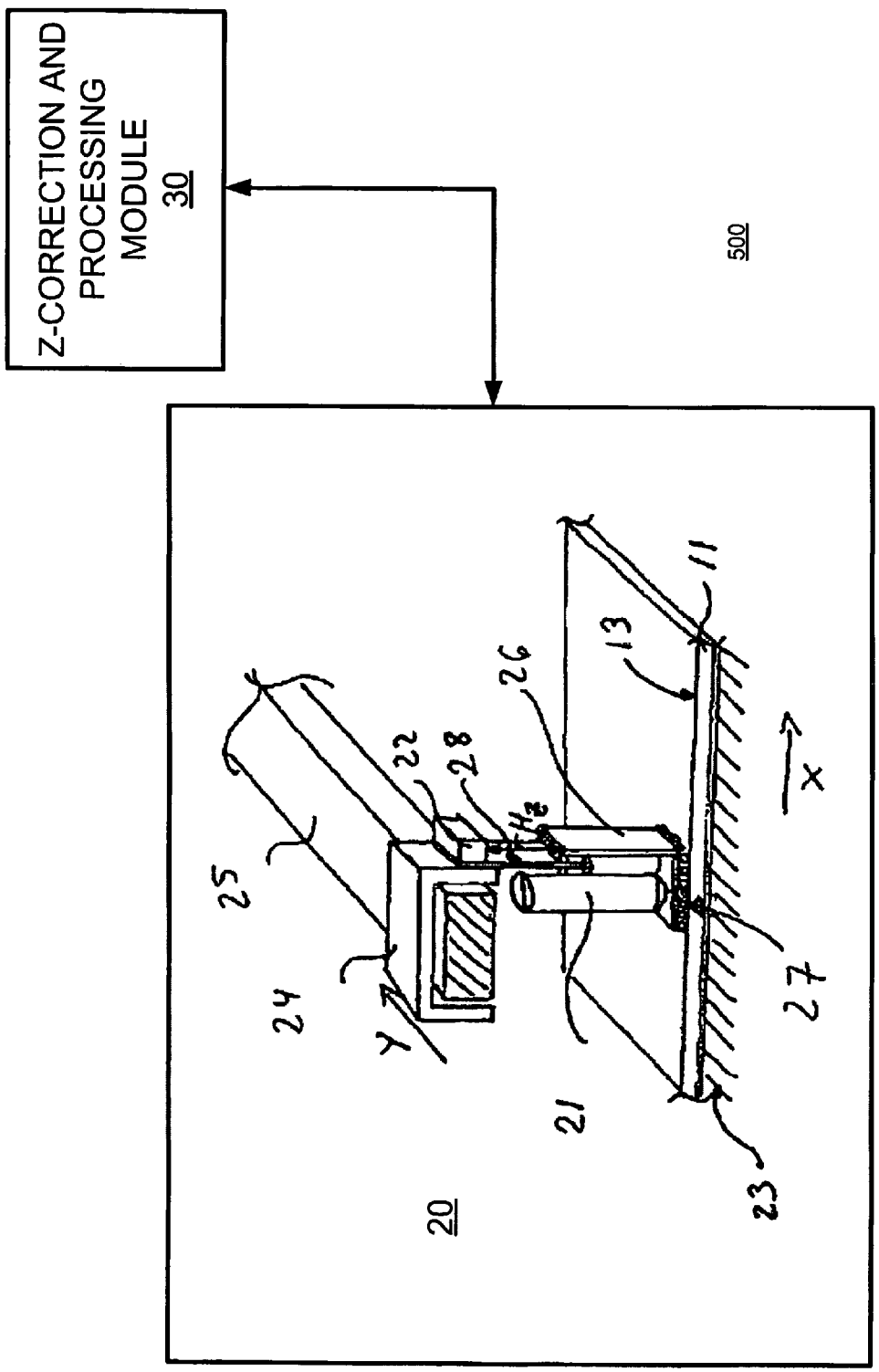
FIG. 5 illustrates a pattern generation system according to an example embodiment.

FIG. 5 shows a pattern generation system according to an example embodiment.

Referring to FIG. 5, the pattern generation system 500 includes a large area (LA) pattern generating apparatus 20, which may also serve as a measuring apparatus. The pattern generating apparatus 20 includes a pattern writing tool or head 21 and a measurement tool 22. The pattern writing tool 21 may include mirrors (e.g., one or more spatial light modulators (SLMs) directing a laser beam emitted from a laser toward a workpiece 11.

The measurement tool 22 may be any known tool capable of measuring the height $H_z$ between the pattern generating apparatus 20 and the surface 13 of the workpiece 11. The workpiece 11 may be, for example, a semiconductor wafer, a plastic material (Polyethylene Terephthalate (PET), Polyethylene Naphthalate (PEN), etc.), chrome coated quartz masks, flexible materials, metals, etc. More specific examples of the workpiece 11 include glass substrates used for display manufacturing, photo masks used for lithography, semiconductor wafers, elastomer based templates, etc.

The workpiece 11 is arranged on a stage 23 with the surface 13 placed upwards. During the patterning (writing) process, the pattern writing tool 21 may be translated or moved over the entire surface of the stage 23.

In one example, the stage 23 is provided with the ability or means to move relative to the pattern writing tool 21 in the X direction, and the pattern writing tool 21 is attached to a sliding support 24 arranged on a beam 25, which moves the pattern writing tool 21 relative to the stage 23 in the Y direction. In another example, the stage 23 may be equipped to move in both the X and Y directions, while the pattern writing tool 21 remains stationary. The stage 23 may be equipped with air bearings or other movement equipment to enable the stage 23 to move in the X and/or Y directions. In yet another example, the pattern writing tool 21 may be equipped to move in both X and Y directions, while the stage 23 remains stationary.

Still referring to FIG. 5, in one example the pattern generating apparatus 20 is also provided with an angled foot plate 26 arranged a constant distance above the surface 13 of the workpiece 11 by an air cushion 27. The foot plate 26 and the pattern writing tool 21 are attached to the sliding support 24 via a flexible attachment 28, to allow the distance between the sliding support 24 and the pattern writing tool 21/foot plate 26 to vary depending on the roughness of the surface 13 of the workpiece 11.

The measurement tool 22 may measure the varying distance in the Z-direction (the height $H_z$) to calculate the roughness or Z-shape of the surface 13 in the Z-direction. The size of the foot plate 26 that is parallel to the surface 13 of the workpiece 11 has an opening for a laser beam from the pattern writing tool 21, and may be relatively large (e.g., about 5 mm on each side) such that the measurement is usable in detecting deviations in height or Z-shape over a relatively large distance. The air cushion 27 beneath foot plate 26 acts as an auto focus device for the pattern generating apparatus 20 due to the constant distance between the foot plate 26 and the workpiece 11.

Referring still to FIG. 5, the pattern generation system 500 further includes a Z-correction and processing module 30. The Z-correction and processing module 30 is illustrated as a module or block, which may represent a module structure within a processor, FPGA, ASIC, etc., of a computer thereby rendering that computing structure a special purpose, structured computer or processor, rather than a general purpose computer or processor. In one example, Z-correction and processing module 30 shown in FIG. 5 may constitute a separate module portion or hardware component of a conventional pattern generation system. The function of the Z-correction and processing module 30 will be discussed in more detail later with regard to FIGS. 3 and 4.

Figure 3:
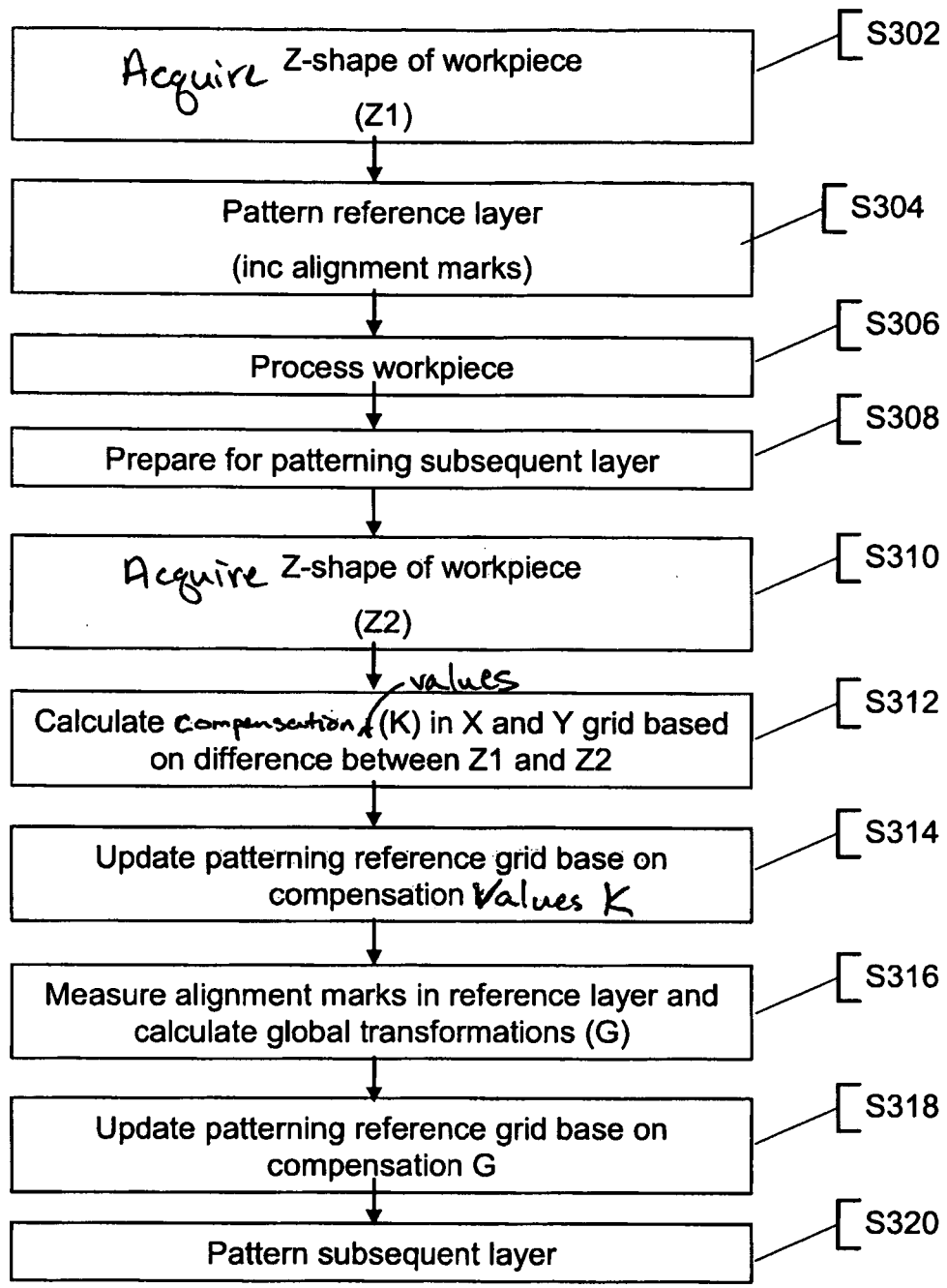
FIG. 3 is a flow diagram illustrating a method for patterning a workpiece according to an example embodiment.

FIG. 3 is a flow diagram illustrating a method for patterning a workpiece according to an example embodiment. The method shown in FIG. 3 may be implemented in the pattern generating system 500 shown in FIG. 5. And, for the sake of clarity, the method shown in FIG. 3 will be discussed as such. However, example embodiments are applicable to other pattern generating apparatuses and systems.

Referring to FIG. 3, at step S302 the pattern generating apparatus 20 acquires a first Z-shape Z1 of the workpiece 11. The Z-shape of the workpiece may be in the form of a mapping or set of measurements $H_{zi}$, wherein each measurement $H_{zi}$ is a measurement of the height of the workpiece 11 in the Z-direction at a given measurement point (or alignment mark).

In more detail, the measurement tool 22 measures the height $H_z$ between the pattern generating apparatus 20 and the workpiece 11 at each of a plurality of measurement points on the workpiece 11 to generate a plurality of measurements for the workpiece 11. The varying distance in the Z-direction or height $H_z$ between the measurement points represents the roughness of the workpiece 11 at a given point on the workpiece 11. The mapping of height measurements $H_{zi}$ represents the Z-shape of the workpiece 11 at a given time.

After being acquired, the first Z-shape Z1 of the workpiece 11 is sent to the Z-correction and processing module 30. The Z-correction and processing module 30 stores the acquired first Z-shape Z1 in a memory (not shown).

Returning to FIG. 3, at step S304 the pattern generating apparatus 20 patterns a first or reference layer on the workpiece 11. In doing so, the workpiece 11 is divided into several measurement points or alignment marks (not shown). The measurement points may correspond in location to the measurement points discussed above with regard to step S302. The apparatus 20 may pattern the reference layer on the workpiece 11 in any known manner 11. Because such methods for doing so are known, a detailed discussion will be omitted.

At step S306, the workpiece 11 is processed. For example, one or more of development, etching, resist spinning or other processes may be performed on the workpiece 11. Because such processes are known, a detailed discussion will be omitted for the sake of brevity. At step S308, the workpiece 11 is prepared to pattern a subsequent layer on the reference layer.

At S310, the apparatus 20 re-acquires the Z-shape (second Z-shape Z2) of the workpiece 11 in the same manner as described above with regard to step S302. The acquired second Z-shape Z2 of the workpiece 11 is sent to the Z-correction and processing module 30. The Z-correction and processing module 30 also stores the acquired second Z-shape Z2 in the memory (not shown).

At S312, the Z-correction and processing module 30 calculates a set SK of compensation values K in the X and Y grid based on the first and second Z-shapes Z1 and Z2. The set of compensation values SK in X and Y is as a map describing how the height $H_z$ varies over the surface at each point on the X and Y grid. In one example, the Z-correction and processing module 30 calculates a compensation value K for each of the plurality of measurement points based on a difference (or a comparison) between corresponding height measurements in the first and second sets of height measurements, which are representative of the respective first and second Z-shapes Z1 and Z2. For example, each compensation value K in the X and Y grid may be given by Equation 1 shown below.

$$K = (H_{Z2} - H_{Z1}) + \frac{T(H_{Z2}) - T(H_{Z1})}{2} \qquad \text{Equation 1}$$

In Equation 1, T is the thickness of the workpiece 11, $H_{z2}$ represents a height measurement at a given measurement point in the second mapping or set (e.g., acquired at S310), and $H_{z1}$ represents a height measurement at a given measurement point in the first mapping (e.g., acquired at S302).

The thickness T of the workpiece 11 at some points on the surface 13 may be measured and/or calculated using at least some of the measurements performed at the measurement points or alignment marks. Because methods for determining/measuring thickness of a workpiece are known, a detailed discussion is omitted. It is noted that Equation 1 is only an example.

According to alternative example embodiments, simpler expressions in which thickness is omitted, or given a predetermined constant value for the Z-shapes Z1 and Z2, may be used. In this example, only the gradient on the surface is compensated. According to example embodiments, interpolation between measurement points may also be used. Because methods for interpolation are known, a detailed discussion will be omitted.

According to yet another example embodiment, the Z-correction and processing module 30 may calculate the Z-direction height H between a reference plane (e.g., plate without particle present in FIG. 1) and the deformed surface (e.g., plate with particle present in FIG. 1) at each measurement point. The height H may be calculated by subtracting the height $H_{zref}$ of the reference surface at a given measurement point from the height $H_{zdef}$ measured by the measurement tool 22 at the same measurement point.

A local offset d (as a function of X and Y) is thereafter calculated (by the Z-correction and processing module 30) for each measurement point. The local offset may depend on the distance between adjacent measurement points P and the measured height H. The local offset d may also depend on the thickness of the workpiece T and the local offset d should be interpreted as the position deviation from the position where a pattern should be written in relationship to the reference surface. The pitch P on the surface of the workpiece differs from the nominal pitch $P_{nom}$ on the reference surface or plane.

The variations in thickness T of the workpiece may be between about 10 μm and about 15 μm, inclusive, but may be larger. The measurement points may be randomly distributed across the surface, but may also be arranged in a grid structure with a given, desired or predetermined distance between each point (pitch), which that is not necessarily the same in the X and Y direction.

The local offset d is a function of the gradient in X and Y direction at each measurement point and may be calculated using relatively simple, known expressions.

For example, an angle α may be calculated based on the measured height H at a given measurement point provided the distance P between two adjacent measurement points is known. For relatively small angles α may be given by:

$$\alpha = \frac{H}{P}.$$

Furthermore, the local offset d may be calculated provided α is small using the formula:

$$d = \frac{T}{2} * \alpha = \frac{H * T}{2 * P}.$$

It should be noted that the formula for calculating the local offset d above is a non-limiting example of a calculation to determine the offset d. The gradient in each measurement point could be directly measured by the system and the local offset d may be proportional to the gradient and the thickness of the plate.

Returning to FIG. 3, at S314 the Z-correction and processing module 30 updates the patterning reference grid for the apparatus based on the set SK of compensation values K. For example, the Z-correction and processing module 30 may update the locations of the alignment marks in the reference pattern based on respective compensation values in the map or set of compensation values SK.

At step S316, the pattern generating apparatus 20 then re-measures alignment marks in the reference layer and the Z-correction and processing module 30 calculates global transformations G. Examples of global transformations that may be used in connection with example embodiments are known transformations such as Affine transformations, projection transformations or other types of transformations. For example, the Z-correction and processing module 30 calculates transformation factors (e.g., rotation, translation, scale, orthogonality, etc.) based on the alignment mark measurements.

At step S318, the Z-correction and processing module 30 updates the reference grid at the pattern generating apparatus 20 based on the calculated global transformations G. For example, the reference grid may be updated based on one or more global transformation(s) to change the size, shape and/or position of the reference grid by using, for example, translations, rotations, scales, reflections and/or shears.

At step S320, the pattern generating apparatus 20 patterns a subsequent layer using the updated reference grid. Again, the subsequent layer may be patterned in any known manner.

Although not explicitly shown in FIG. 3, the process may be repeated after patterning each of a plurality of layers during a multi-layer patterning process until the desired multi-layer pattern is generated.

According to example embodiments, the acquisition of the Z-shape relative to the patterning of the first or reference layer may take place before, during or after the specific patterning process. Regardless of the order, the Z-shape should reflect the condition or state of the workpiece when the first pattern was created.

Figure 4:
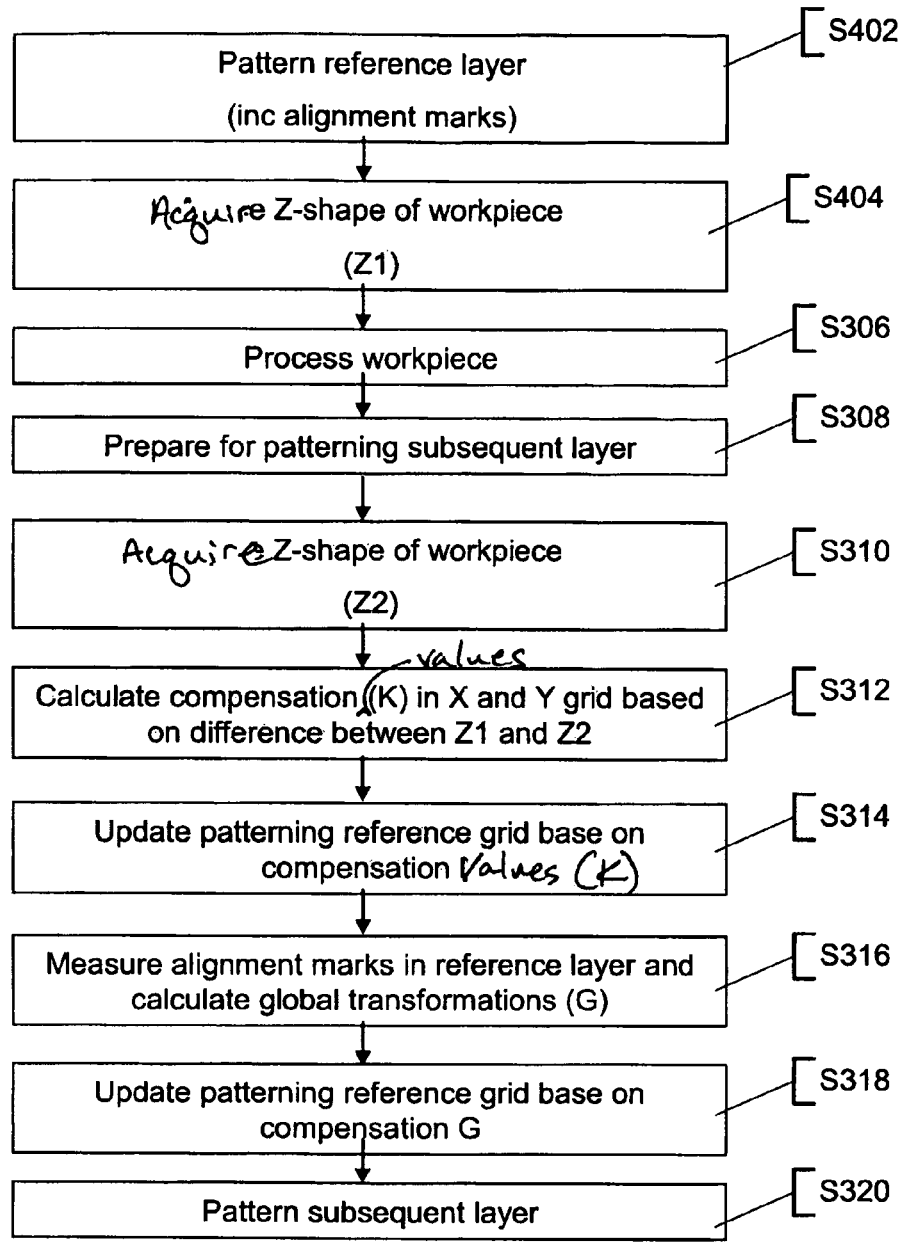
FIG. 4 is a flow diagram illustrating a method for patterning a workpiece according to another example embodiment.

FIG. 4 is a flow diagram illustrating a method for patterning a workpiece according to another example embodiment. The method shown in FIG. 4 is similar to the method shown in FIG. 3; except that the acquisition of the first Z-shape Z1 is performed after the reference layer has been patterned, rather than before. The method shown in FIG. 4 may also be implemented in the pattern generation system 500 shown in FIG. 5. And, for the sake of clarity, the method shown in FIG. 4 will be discussed as such. However, example embodiments are applicable to other pattern generating apparatuses and/or systems.

Referring to FIG. 4, at step S402 the pattern generating apparatus 20 patterns a first or reference layer on the workpiece 11. The pattern generating apparatus 20 may pattern the first or reference layer in the same manner as described above with regard to step S304. At step S404, the pattern generating apparatus 20 acquires a first Z-shape Z1 of the workpiece 11. The pattern generating apparatus 20 acquires the first Z-shape Z1 in the same manner as described above with regard to step S302. The acquired first Z-shape Z1 of the workpiece 11 is sent to the Z-correction and processing module 30. The Z-correction and processing module 30 stores the acquired first Z-shape Z1 in a memory (not shown).

After the first Z-shape Z1 is acquired at step S404, each of steps S306-S320 described above with regard to FIG. 3 is performed to pattern the workpiece. Because these steps have been described in detail above, further discussion will be omitted for the sake of brevity.

As is the case with FIG. 3, although not explicitly shown in FIG. 4, the process may be repeated after patterning each of a plurality of layers during a multi-layer patterning process until the desired multi-layer pattern has been created.

Methods and apparatuses according to example embodiments use the fact that the difference in Z-shape between two patterning steps or measurements describes, in a relatively predictable fashion, the difference in distortions of the plate in the X-Y plane between the two moments in time.

According to example embodiments, the measurement of the Z-shape of the workpiece does not require any marks (e.g., alignment marks) in any layers, and therefore, this property may be measured within areas dedicated to carry functional patterns.

Example embodiments also provide methods and apparatuses capable of correcting overlay errors due to Z-shape without changing the absolute registration of the machine or apparatus by only compensating for the Z-difference between the first layer or pass and the layers or passes to be written subsequently. Thus, utilizing example embodiments, the photomask maker may achieve improved overlay quality between exposures of multiple patterning steps while maintaining control of their reference registration and the use of this function may be transparent, substantially transparent or totally transparent to the end customer. In addition, methods according to example embodiments put little or no extra requirements on the measurement machine or tool used to verify the registration.

Example embodiments may also be usable in patterning smaller workpieces, for example, about 6 inch photomasks for semiconductor applications. These workpieces are normally supported on a three point support to create a controlled plate support. However, in some cases the process (e.g., develop, bake, etch, etc.) may change the properties of the workpiece. Moreover, in some cases the pattern itself may locally change the properties of the plate. This change in properties may be, for example, the modulus of elasticity (Young's modulus), which may affect the workpiece both globally and locally. The difference measured in the shape of the workpiece surface between two patterning steps in accordance with example embodiments may be used for semiconductor applications in to improve overlay capability.

In addition to the pattern generation system described above with regard to FIG. 5, at least the methods according to example embodiments may be implemented in any conventional pattern generating apparatus for writing a pattern on a surface of a workpiece including: a stage supporting the workpiece provided with a surface, where said surface is divided into a number of measurement points; means to determine the gradient of the surface at some measurement points; means to calculate a two-dimensional local offset (d) in the X-Y plane for some measurement point as a function of at least the gradient; and means to correct the pattern to be written on said surface by using the two-dimensional local offset (d).

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A method for patterning and aligning a workpiece, the method comprising:
   acquiring a first Z-shape of the workpiece;
   patterning a reference grid on the workpiece;
   acquiring a second Z-shape of the workpiece;
   calculating a set of compensation values based on the acquired first and second Z-shapes;
   updating the reference grid based on the calculated set of compensation values; and
   patterning a subsequent layer of the workpiece.

2. The method of claim 1, further comprising:
   processing the workpiece before acquiring a second Z-shape of the workpiece.

3. The method of claim 1, further comprising:
   patterning alignment marks after acquiring a first Z-shape of the workpiece.

4. The method of claim 1, further comprising:
   patterning alignment marks before acquiring a first Z-shape of the workpiece.

5. The method of claim 1, further comprising:
   calculating at least one global transformation based on the calculated set of compensation values; and
   updating the reference grid based on the global transformation.

6. The method of claim 5, wherein the at least one global transformation is an affine transformation, a project transformation or other type of linear transformation.

7. The method of claim 1, wherein the reference grid is patterned by a first pattern generator and the subsequent layer is patterned by a second pattern generator.

8. The method of claim 1, wherein the overlay errors due to a difference between the first Z-shape and the second Z-shape are compensated for without changing absolute registration.

9. The method of claim 1, wherein the acquiring of the first Z-shape comprises:
   measuring a height in the Z-direction at each of a plurality of measurement points on the workpiece to generate a set of first height measurements.

10. The method of claim 9, wherein the acquiring of the second Z-shape comprises:
    measuring a height in the Z-direction at each of a plurality of measurement points on the workpiece to generate a set of second height measurements.

11. The method of claim 10, wherein the set of compensation values includes a compensation value corresponding to each of the plurality of measurement points, the calculating of each of the compensation values comprising:
    calculating a difference between a first height measurement and a second height measurement at a measurement point among the plurality of measurement points; and
    calculating the compensation value for the measurement point based on the calculated difference and the thickness of the workpiece.

* * * * *